United States Patent [19]

Sekiguchi

[11] Patent Number: 5,958,632

[45] Date of Patent: Sep. 28, 1999

[54] METHOD OF MAKING MASK PATTERN UTILIZING SIZING DEPENDENT ON MASK MATERIAL AND MASK FORMED THROUGH THE METHOD

[75] Inventor: Atsushi Sekiguchi, Kanagawa, Japan

[73] Assignee: Sony Corporation, Tokyo, Japan

[21] Appl. No.: 09/104,208

[22] Filed: Jun. 25, 1998

[30] Foreign Application Priority Data

Jun. 25, 1997 [JP] Japan ................................. 9-168994

[51] Int. Cl.$^6$ ........................................................ G03F 9/00
[52] U.S. Cl. ................................. 430/5; 430/22; 430/30
[58] Field of Search .............................. 430/5, 22, 296, 430/30

[56] References Cited

U.S. PATENT DOCUMENTS 5,208,124  5/1993  Sporon-Fiedler et al. ............... 430/296
5,432,714  7/1995  Chung et al. ............................. 430/30
5,792,581  8/1998  Ohnuma .................................... 430/30

*Primary Examiner*—Christopher G. Young
*Attorney, Agent, or Firm*—Ronald P. Kananen; Rader, Fishman & Grauer

[57] ABSTRACT

A method of making a mask pattern is provided for achieving an alignment mark closer to the size of design pattern with any mask material and with any type and size of target pattern so that overlay accuracy of micro target pattern is improved. Sizing processing is performed on an alignment mark pattern (design pattern) in each step of pattern formation process, depending on a mask material (resist) and a type and a size of a target pattern. A sizing pattern thereby formed is printed on a mask substrate. The form and size of printed pattern is substantially equal to the alignment mark pattern of the design size.

10 Claims, 2 Drawing Sheets

METHOD OF MAKING MASK PATTERN UTILIZING SIZING DEPENDENT ON MASK MATERIAL AND MASK FORMED THROUGH THE METHOD

BACKGROUND OF THE INVENTION

1. Field of the Invention

The present invention relates to a method of making a mask pattern and a mask used in photolithography techniques for ultra large scale integration (ULSI) and particularly to a method of making a mask pattern including a microcircuit pattern (an actual pattern) which will be called target pattern in the following description and an alignment mark pattern for overlaying and a mask formed through the method.

2. Description of the Related Art

As the demand for achieving microstructural semiconductor chips grows, target pattern dimensions have been reduced down to a width of 0.2 to 0.35 μm. The demand for overlay accuracy increases with the reduction in target pattern width. That is, a ULSI circuit has different structures in depth and requires masks with microcircuit patterns different among depths. If overlay accuracies among the masks and a wafer are low, manufacturing yields are reduced. In order to improve overlay accuracy, methods are generally known for improving stage accuracy, measurement systems and manufacturing processes, if categorized broadly. In photolithography techniques in particular, improvements in formation of an alignment mark for overlaying a mask on a wafer are required.

More than a decade of research and development has been made on microstructure techniques of mask patterns (target patterns) with photolithography techniques and has demonstrated great improvements. The improvements greatly owe to a short-wavelength exposure light source, a high numerical aperture (NA) of lens and improvements in resists. For forming such fine target patterns, an exposure system is used such as a reduction-type projection printing stepper using i-lines of mercury lamp (wavelength of 365 nm) and excimer laser of KrF, for example (wavelength of 248 nm). While improvements have been made in microstructure techniques of target patterns, no great modifications have been made on alignment mark geometries since a stepper was first introduced.

However, there are problems in keeping on using alignment marks previously developed. This is partly due to a change in resists to a chemically amplified resist used for excimer laser such as KrF of short wavelength. Solubility of the chemically amplified resist is improved with the aid of reaction produced by an exposure. In forming microscale patterns, the chemically amplified resist offers excellent line width linearity or critical dimension (CD) linearity. In forming a greater pattern (10 to 12 μm) such as an alignment mark, however, it is known that a great deviation from a designed size may occur due to reduced linearity. Such deviation in alignment mark size affects overlay accuracy (alignment accuracy) of a target pattern for printing a fine target pattern and particularly affects scaling for writing an enlarged or reduced pattern of original. In addition to such a problem due to reduced linearity, degradation in mark geometries is known due to the use of high numerical aperture lens and a halftone phase shift mask (HT-PSM) for achieving finer patterns. This is because an exposure is often made regardless of resist linearity (such as an over exposure with greater exposure energy) in order to form a target pattern of size around the resolution limit (248 nm) of the resist or below.

Deviation in alignment marks resulting from the factors as described so far is often seen. FIG. 1A to FIG. 1D illustrates examples of degradation of alignment mark patterns of LSA marks of 5 to 10 μm, for example. FIG. 1A illustrates a design pattern of an alignment mark pattern 200 for overlaying a micro target pattern 100 of 0.2 to 0.3 μm in line width. FIG. 1B illustrates a plane geometry of printed pattern of alignment mark pattern 200 with a typical resist (novolak base resist) for i-lines and g-lines used in a process for forming a relatively rough pattern. FIG. 1C illustrates a plane geometry of printed pattern of alignment mark pattern 200 with a chemically amplified resist for a KrF excimer laser used in a process for forming a relatively fine pattern and with an over exposure. FIG. 1D illustrates a plane geometry of printed pattern of alignment mark pattern 200 formed further with an HT-PSM as a mask in a condition similar to that of FIG. 1C. With the typical novolak base resist, as shown in FIG. 1B, an optical proximity effect is only produced in corners of the mark. As shown in FIG. 1C, the overall mark geometry is reduced with the chemically amplified resist and with an over exposure. The pattern is further reduced with the HT-PSM, as shown in FIG. 1D. The tendency of reduction depends on a resist, line width of a target and so on. Enlarging and reduction of a design pattern are thus repeated.

As described so far, an alignment mark pattern is degraded and great deviation from a design pattern results, due to the use of resists different among pattern formation processes, the use of an HT-PSM and so on. Such deviation of alignment mark patterns greatly affects overlay accuracy of micro target patterns. Product yields will be therefore reduced.

SUMMARY OF THE INVENTION

It is an object of the invention to provide a method of making a mask pattern and a mask formed through the method in order to achieve an alignment mark closer to the size of design pattern with any mask material and with any type and size of target pattern so that overlay accuracy of fine target pattern is improved.

A method of making a mask pattern of the invention includes the step of performing sizing processing on a design pattern of an alignment mark pattern for overlaying depending on a mask material in each step of a pattern formation process.

A mask of the invention includes a target pattern and an alignment mark formed through printing an alignment mark pattern wherein sizing processing is performed on a design pattern of the alignment mark pattern depending on a mask material.

In the method of making a mask pattern of the invention, sizing processing is performed on the design pattern of the alignment mark pattern in each step of pattern formation process. If a chemically amplified resist is used as a mask material for excimer laser of KrF, for example, and deviation of the alignment mark pattern occurs resulting from the resist, an alignment mark of a size equal to that of the design pattern is obtained.

The mask of the invention includes the target pattern and the alignment mark formed through printing the alignment mark pattern wherein sizing processing is performed on the design pattern depending on a mask material. As a result, the size of the alignment mark pattern is equal to that of the design pattern. The mask with the alignment mark therefore achieves an improvement in overlay accuracy of the target pattern.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

A method of making a mask pattern of the embodiment of the invention is provided for making a mask pattern including a target pattern (an actual pattern) for a mask and an alignment mark pattern. In each step of pattern formation process, sizing processing and proximity effect correction are performed on the alignment mark pattern depending on a mask material (resist) and a type (line or hole) and a size of the target pattern.

A plurality of steps are provided in a pattern formation process in photolithography techniques applied to semiconductor device production. Mask materials different among the steps may be used. For example, i-lines (wavelength of 365 nm) and g-lines (wavelength of 436 nm) are used for exposure in a step of forming a relatively rough pattern as described above. A novolak base resist is typically used as a mask material for i-lines and g-lines. In contrast, KrF excimer lasers (wavelength of 248 nm) are used in a step of forming a finer pattern. A high-resolution chemically amplified resist with high solubility in reaction to exposure is used for the lasers. With such a chemically amplified resist, great deviation of alignment mark pattern from the size of design pattern often occurs. A reduction in overlay accuracy of fine target pattern thus results as described above.

The embodiment therefore provides sizing (resizing) processing previously performed on an alignment mark pattern depending on a mask material. That is, enlarging or reducing pattern width of a design pattern is performed for canceling out deviation of alignment mark due to difference in mask materials (resists). Overlay accuracy of a mask is thereby improved.

In addition to mask materials, a degree of sizing is determined depending on a type and a size of target pattern in the embodiment.

Figure 3:
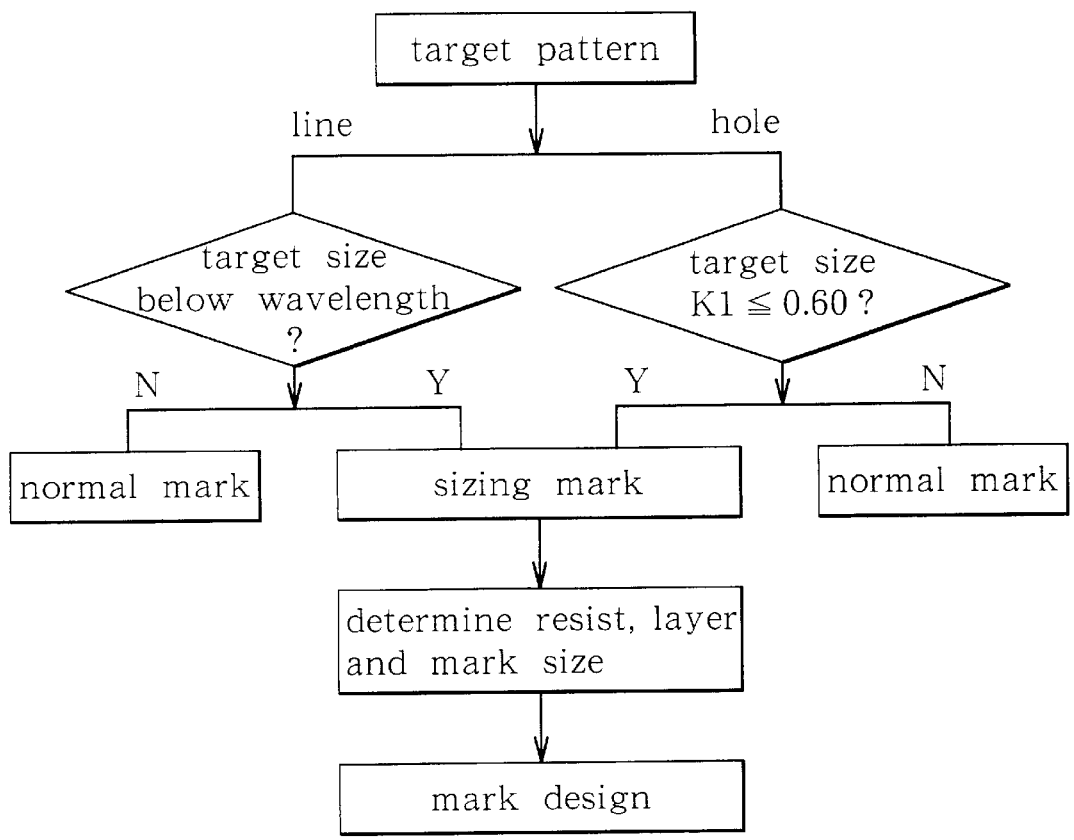
FIG. 3 is a flowchart for describing how to determine an applicable mask in the method of making a mask pattern shown in FIG. 2A to FIG. 2C.

FIG. 3 illustrates a routine of determining a mask depending on a type and a size of target pattern. Target patterns are broadly divided into lines such as wiring and holes such as contact holes. If a target pattern is a line, sizing processing of the embodiment is performed when line width is equal to or below a wavelength of exposure light source. If line width is greater than a wavelength of exposure light source, processing of known art is performed without sizing processing. On the other hand, if a target pattern is a hole, sizing processing is performed on an alignment mark pattern when hole diameter is equal to or below a given size ($k_1 \leq 0.60$ where $k_1$ is a process constant). If hole diameter is greater than the given size ($k_1 > 0.60$), processing of known art is performed without sizing processing. When a target pattern is either a line or a hole, a mask is designed after determining a resist and a layer to be used and an alignment mark size wherein sizing processing is performed.

Figures 1A, 1B, 1C, 1D:
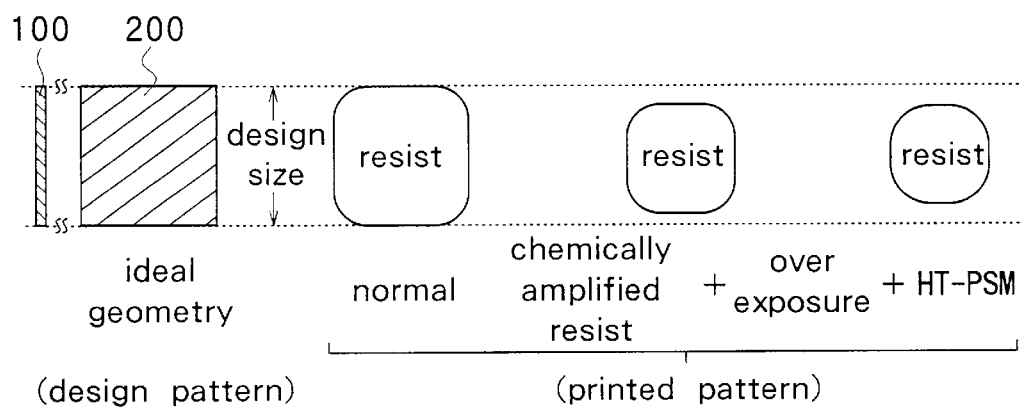
FIG. 1A, FIG. 1B, FIG. 1C and FIG. 1D are top views for illustrating degradation of alignment marks of related art.

In addition to the sizing processing described above, proximity effect correction is performed in the embodiment. This allows alignment mark pattern geometry to be closer to design pattern geometry. A proximity effect is often found in electron beam exposure in general, wherein rays of light passing through neighboring mask patterns interfere with each other and affect pattern geometry. Overlay accuracy depends on a pattern in optical exposure as well. As shown in FIG. 1B to FIG. 1D, corners of printed pattern may be chipped. In order to prevent such influences of proximity effect, corners of a square alignment mark pattern, for example, are partly enlarged or reduced in the embodiment. Deviation in corners of the pattern due to a proximity effect is thereby suppressed. Together with the sizing processing, this correction allows an alignment mark pattern to be of a size nearly similar to a design pattern and of geometry similar to the design pattern. Overlay accuracy of fine target pattern is thus improved. As a result, even when deviation of alignment mark pattern from a design pattern occurs where a high numerical aperture exposure lens is used or an HT-PSM is used for a mask for increasing resolution, high overlay accuracy is maintained and semiconductor chip yields are improved.

Figures 2A, 2B, 2C:
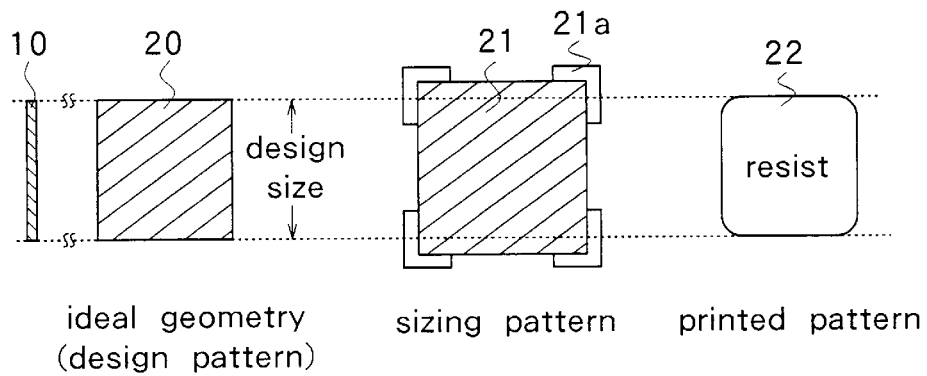
FIG. 2A, FIG. 2B and FIG. 2C are top views for illustrating a method of making a mask pattern of an embodiment of the invention.

FIG. 2A to FIG. 2C illustrate examples to which the embodiment is applied. FIG. 2A shows a design pattern of an alignment mark pattern 20 corresponding to a target pattern 10. FIG. 2B shows a sizing pattern 21 produced through performing sizing processing (enlarging) and proximity effect correction on the design pattern of the alignment mark pattern 20. L-shaped enlarging sections (modification patterns) 21a are provided on the corners of the sizing pattern 21 for proximity correction. FIG. 2C shows a printed pattern 22 of the sizing pattern 21 printed on a resist on a mask substrate. The size of the printed pattern 22 is substantially equal to that of the alignment mark pattern 10 of the design pattern. Although there are slight influences of proximity effect on the corners, the degree of influences is significantly reduced compared to the examples shown in FIG. 1C and FIG. 1D.

A mask of the embodiment of the invention is made up of a halftone phase shift mask. Sizing processing in the method described above is performed on an alignment mark pattern, depending on a mask material and a type and a size of a target pattern. Proximity effect correction is further performed on the pattern. Together with the micro target pattern, the alignment mark pattern is printed to form an alignment mark.

Since the size of the alignment mark pattern is equal to that of the design pattern, the mask of the embodiment achieves an improvement in overlay accuracy.

(EXAMPLE 1)

An alignment mark (LAS mark) pattern of the embodiment of the invention is utilized in a process of forming a contact hole of 0.25 μm. A chemically amplified resist is used as a mask material. An exposure light source of KrF excimer (wavelength of 254 nm) is used. Sizing (enlarging) processing of 0.3 μm width is performed on the alignment mark pattern. Proximity effect correction is performed on the corners of the pattern. Overlay accuracy with the alignment mark pattern is examined in an evaluation test of 'resist versus resist' wherein a resist pattern is overlaid on a resist pattern on a silicon wafer. It is found that deviation of 90 nm is improved in |X| (mean value)+3 σ (standard deviation). A scaling component of 0.4 ppm is improved in a factorial experiment.

(EXAMPLE 2)

As in Example 1, an alignment mark (LAS mark) pattern of the embodiment of the invention is utilized in a process of forming a contact hole of 0.25 μm. A chemically amplified resist is used as a mask material. An exposure light source of KrF excimer (wavelength of 254 nm) is used. Sizing (enlarging) processing of 0.3 μm width is performed on the alignment mark pattern. Proximity effect correction is performed on the corners of the pattern. Overlay accuracy with the alignment mark pattern is examined in an evaluation test of 'aluminum contact hole versus aluminum film'. In the evaluation test an aluminum (Al) film is formed on an insulator ($SiO_2$) having a contact hole on a silicon wafer. A resist pattern including a pattern corresponding to the contact hole is overlaid on the aluminum film. It is found that deviation of 110 nm is improved in |X|+3σ. A scaling component of 0.4 ppm is improved in a factorial experiment.

The invention is not limited to the embodiment described so far but may be practiced in still other ways. In the foregoing embodiment, sizing processing is selectively performed on the alignment mark pattern in each step of pattern formation process, depending on a mask material (resist) and a type (line or hole) and a size of the target pattern. Proximity effect correction is further performed. Alternatively, sizing processing may be performed depending on a mask material only.

In the method of making a mask pattern of the invention as described so far, sizing processing is performed on the design pattern of the alignment mark pattern in each step of pattern formation process. If a chemically amplified resist is used as a mask material for excimer laser of KrF, for example, and deviation of the alignment mark pattern occurs resulting from the resist, an alignment mark of a size close to that of the design pattern is achieved. Overlay accuracy of the target pattern is thereby improved and semiconductor chip yields are improved. Overlay accuracy of the target pattern is further improved with proximity effect correction.

The mask of the invention includes a target pattern and an alignment mark formed through printing a target pattern wherein sizing processing is performed on the design pattern depending on a mask material. As a result, the size of the alignment mark pattern is close to that of the design pattern. The mask with the alignment mark therefore achieves an improvement in overlay accuracy and semiconductor chip yields.

Obviously many modifications and variations of the present invention are possible in the light of the above teachings. It is therefore to be understood that within the scope of the appended claims the invention may be practiced otherwise than as specifically described.

What is claimed is:

1. A method of making a mask pattern including a target pattern for a mask and an alignment mark pattern for overlaying, including the step of:

performing sizing processing on a design pattern of the alignment mark pattern depending on a mask material in each step of a pattern formation process.

2. A method of making a mask pattern according to claim 1 wherein the sizing processing is performed depending further on a type and a size of the target pattern.

3. A method of making a mask pattern according to claim 2 wherein the sizing processing is performed when the target pattern has a shape of line and line width is equal to or below a wavelength of an exposure light source or the target pattern has a shape of hole and hole diameter is equal to or below a specific size.

4. A method of making a mask pattern according to claim 1 wherein proximity effect correction is further performed on the design pattern of the alignment mark pattern.

5. A method of making a mask pattern according to claim 4 wherein the alignment mark pattern has a shape of square and proximity effect correction is performed on each of corners of the square.

6. A method of making a mask pattern according to claim 1, wherein the sizing processing includes enlarging the design pattern.

7. A mask including a target pattern and an alignment mark formed through printing an alignment mark pattern wherein sizing processing is performed on a design pattern of the alignment mark pattern depending on a mask material.

8. A mask according to claim 7 wherein the alignment mark is formed through printing the alignment mark pattern wherein sizing processing is performed on the design pattern depending on a type and a size of a target pattern in addition to the mask material and proximity effect correction is performed on the design pattern.

9. A mask according to claim 7 formed through the use of a halftone phase shift mask.

10. A mask according to claim 7, wherein the sizing processing includes enlarging the design pattern.

* * * * *